(12) United States Patent
Watanabe et al.

(10) Patent No.: US 6,328,427 B1
(45) Date of Patent: *Dec. 11, 2001

(54) METHOD OF PRODUCING A WIRING SUBSTRATE

(75) Inventors: Kenjiro Watanabe, Tokyo; Koji Yamakawa, Yokohama, both of (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/897,550

(22) Filed: Jul. 21, 1997

Related U.S. Application Data

(63) Continuation of application No. 08/183,419, filed on Jan. 19, 1994, now abandoned.

(30) Foreign Application Priority Data

Jan. 19, 1993 (JP) ................................ 5-006980
Dec. 27, 1993 (JP) ................................ 5-331104

(51) Int. Cl.[7] .......................... B41J 2/05; H01R 13/02
(52) U.S. Cl. ................................ 347/58; 439/886
(58) Field of Search ................ 347/58, 50; 439/886; 174/68.5

(56) References Cited

U.S. PATENT DOCUMENTS

| | | | |
|---|---|---|---|
| 3,927,841 | * 12/1975 | Iacobucci | 339/278 |
| 4,032,929 | * 6/1977 | Fischbeck et al. | 347/42 |
| 4,327,247 | * 4/1982 | Mituhashi | 174/68.5 |
| 4,503,131 | 3/1985 | Baudrand | 428/672 |
| 4,635,080 | 1/1987 | Watanabe | 346/140 R |
| 4,801,067 | * 1/1989 | Kondo | 228/123 |
| 4,881,318 | * 11/1989 | Komuro et al. | 29/827 |
| 5,182,580 | 1/1993 | Ikeda et al. | 346/140 R |

FOREIGN PATENT DOCUMENTS

| | | |
|---|---|---|
| 4-402811 | 12/1990 | (EP). |
| 60-107845 | 6/1985 | (JP). |
| 60-255995 | 12/1985 | (JP). |
| 1-86525 | 3/1989 | (JP). |
| 4-51582 | 2/1992 | (JP). |
| 4-116837 | 4/1992 | (JP). |

OTHER PUBLICATIONS

English Version JP64–86525 (IDS), Mar. 1989, Japan.*

* cited by examiner

Primary Examiner—N. Le
Assistant Examiner—Shih-Wen Hsieh
(74) Attorney, Agent, or Firm—Fitzpatrick, Cella, Harper & Scinto

(57) ABSTRACT

A flexible printed circuit board has a copper foil serving as a conductive pattern, a nickel layer and a gold layer stacked in sequence on a base film made of polymide at an area to be electrically connected by wire bonding. The wire bonding is made by an aluminum wire and the nickel layer having a thickness of 10 $\mu$m to 20 $\mu$m. An ink jet recording head for discharging ink droplets from a discharge port onto a recording medium for recording thereon is electrically connected to an ink discharge unit by the flexible printed circuit board.

7 Claims, 5 Drawing Sheets

METHOD OF PRODUCING A WIRING SUBSTRATE

This application is a continuation of application Ser. No. 08/183,419 filed Jan. 19, 1994, now abandoned.

BACKGROUND OF THE INVENTION

1. Field of the Invention

The present invention relates to a flexible printed circuit board, and more particularly to a flexible printed circuit board for electrical connection by wire bonding and an ink jet recording head using the same.

2. Related Background Art

As the size of an electronic equipment is reduced, a flexible printed circuit board (FPC) is widely used in view of the freedom of packaging form and the space saving. In connecting the FPC and other wiring material or an electronic part mounted on the FPC, a wire bonding (WB) is frequently used when a high density packaging is required or a packaging space is limited.

An ink jet recording head is explained as an example of using the WB for the connection of the FPC.

FIG. 8 shows a sectional view of a packaging unit of an ink jet recording head previously proposed by the inventors of the present invention, as an example of the use of the WB for the connection of the FPC.

FIGS. 4A and 4B show perspective views of the ink jet recording head of FIG. 8.

An overall construction of the ink jet recording head is explained with reference to FIGS. 4A, 4B and FIG. 8.

On an upper surface of a support plate 5 made of aluminum, a heater board 4 having an Si substrate on which a heater for applying a thermal energy to ink is formed and one end of an FPC 1 for transmitting an electrical signal sent from a main unit of a recording apparatus to the heater board 4 are electrically connected by a wire bonding 12. The FPC 1 is bent toward a rear surface (lower surface) of the support plate 5 and the other end of the FPC 1 is connected to the support plate 5. Contact pads 111 which are electrically connected to a contact pad of the main unit of the recording apparatus are formed on the FPC 1. The ink jet recording head is supplied with the electrical signal from the main unit of the recording apparatus through the contact pads 111 on the FPC 1. The support plate 5 is covered with a packaging cover 9 and ink is supplied from the main unit of the recording apparatus to a grooved top plate 8 having a common liquid chamber and discharge ports 10 forming nozzles through an ink supply member 11 provided in the packaging cover 9, and it is heated by the heater on the heater board 4 and discharged from the discharge ports 10. Sealing agent 10 such as silicone rubber is applied to the connecting area of the wires 12 to protect the bonding part from an external force.

A layer structure of the WB connecting part of the FPC 1 is now explained with reference to FIG. 7.

The layer structure in the connecting part of the FPC 1 usually comprises, starting from a bottom layer, reinforcing plate 101 made of glass epoxy and provided only on the support member, a bonding layer 108 made of a acryl resin, a base film 103 made of polymide, a bonding layer 104 made of epoxy resin, a conductive layer 105 (10–35 $\mu$m) made of a copper foil, a nickel plating layer 109 (2–3 $\mu$m), a gold plating layer 107 (1 $\mu$m) serving as a contact member, in this order. Since the nickel plating layer is provided to enhance the contact of the copper of the conductive layer and the gold of the contact member, a thickness of 2–3 $\mu$m is sufficient.

The FPC 1 is bonded to the substrate 5 by the bonding material 2a applied to the reinforcement plate 101. Other printed circuit board 7 is also bonded to the substrate 5 by the bonding material 2b.

The gold plating layer 107 of the FPC 1 and the WB pad 701 of the other printed circuit board 7 are electrically connected by a gold wire 12. The gold wire, the gold plating layer 107 and the WB pad 701 are ball-bonded.

In such an FPC, where a number of wires are required as it is in an ink jet recording head, aluminum wires may be used for the WB because the gold wires are expensive.

However, when the aluminum wires are used for the WB in the prior art FPC, defects in the connection are frequently found and a yield is very low.

SUMMARY OF THE INVENTION

It is an object of the present invention to provide an FPC which permits highly reliable WB packaging by an aluminum wire with a stable condition.

It is another object of the present invention to provide a highly reliable and inexpensive ink jet recording apparatus which uses the FPC.

DETAILED DESCRIPTION OF THE PREFERRED EMBODIMENTS

One embodiment of the present invention is now explained.

When an aluminum wire is to be wire bonded, it is difficult to fuse it at a low temperature unlike a gold wire and the bonding is made by a wedge bonding using an ultrasonic wave. However, in the prior art FPC, the vibration by the ultrasonic wave is attenuated because of an insufficient hardness of a base film and defects occur in the connection. The defects in the connection may be eliminated by increasing a strength of the ultrasonic wave but the wire at the connecting part is collapsed by the enhanced ultrasonic bonding and a strength at a neck of the wire is lowered. As a result, the bonding strength is lowered. In the present invention, a thickness of a nickel layer which is provided to enhance the contact between copper and gold is increased to attain the enhancement of the hardness of the base film and the strength of the aluminum wire bonding without modifying the prior art process.

A test result of the thickness of the nickel layer is shown below.

Figure 2:
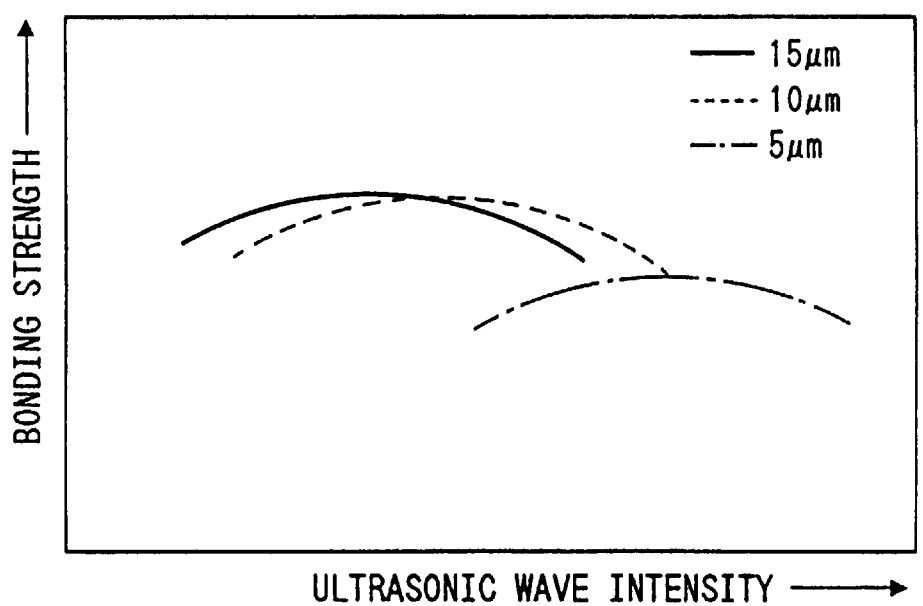
FIG. 2 shows a graph of a relation between a nickel plating thickness and a WB strength.

FIG. 2 shows a relation between an ultrasonic wave strength and a pull strength (bonding strength) after the wire bonding for three nickel layers having thicknesses of 5, 10 and 15 $\mu$m, respectively. The pull strength is measured by pulling the wire until it is broken while the wire at the connection part of the FPC is pulled by a needle with a weight.

Figure 9:
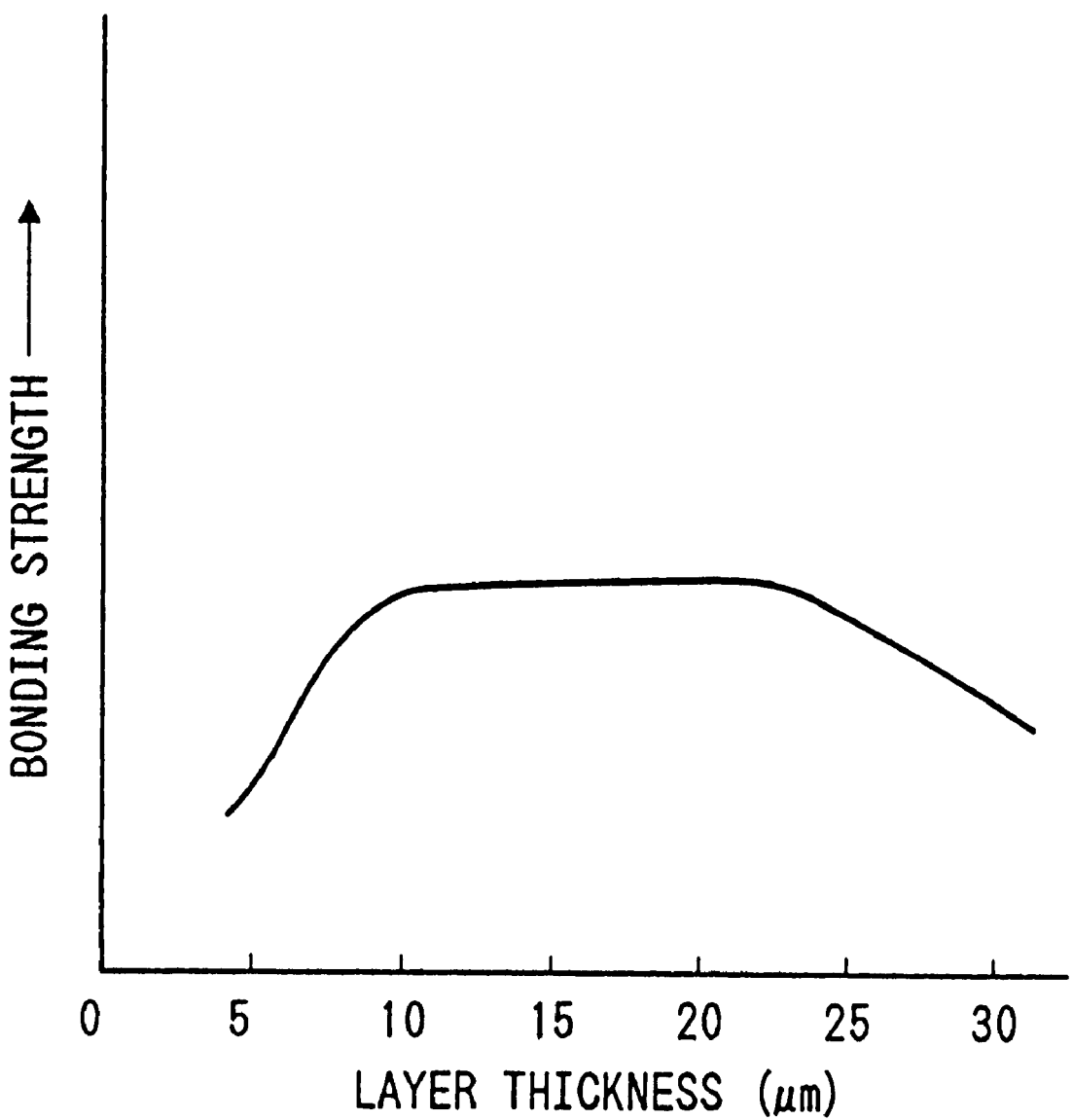
FIG. 9 shows a relation between a thickness of a nickel layer and a maximum wire bonding strength at that thickness.

FIG. 9 shows a relation between the thickness of the nickel layer and a maximum WB strength at that thickness.

As seen from FIG. 9, when the thickness of the layer is more than 10 $\mu$m, the maximum WB strength does not significantly change. When it exceeds 20 $\mu$m, the bonding strength again starts to decrease. As seen from FIG. 2, the layer having the thickness of 10 $\mu$m or 15 $\mu$m can be bonded with a much lower ultrasonic wave strength than that of the layer having the thickness of 5 $\mu$m and the bonding strength is higher. The bonding at a low ultrasonic wave strength means that the wire may be bonded without substantial collapse and a sufficient margin may be assured at the neck of the wire. The inventors have found that there is no significant difference between 10 $\mu$m and 15 $\mu$m and a sufficient bonding condition is attained when the thickness is no less than 10 $\mu$m. When the thickness of the nickel plating is unduly large, the plating process takes a long time and a production efficiency is lowered, the flatness of the plating surface is damaged, the bonding area is reduced and the bonding strength is reduced. Accordingly, the thickness bewteen 10 $\mu$m and 20 $\mu$m is most preferable in view of the precision of the plating process.

Figure 3:
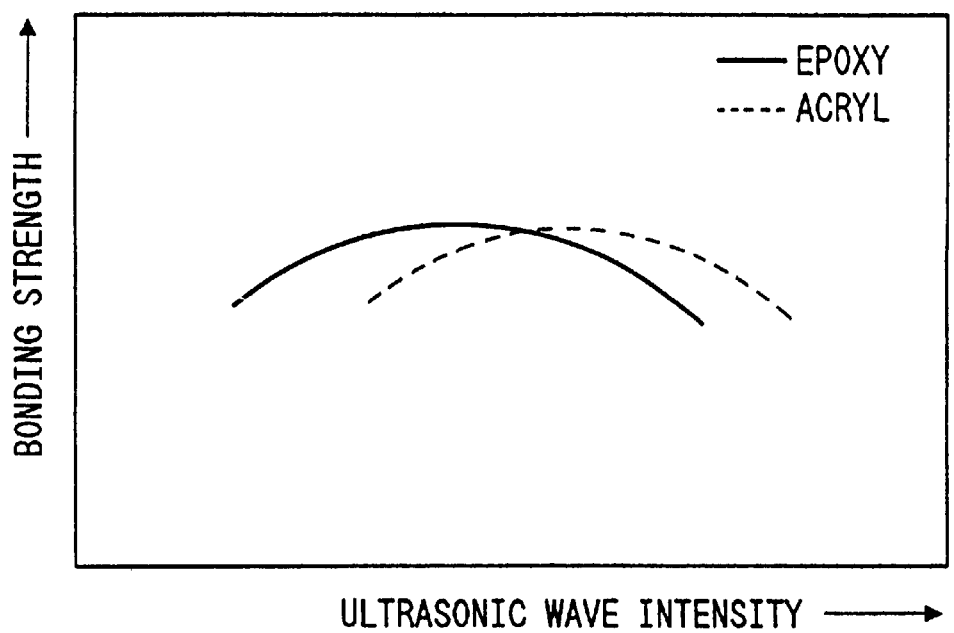
FIG. 3 shows a graph of a relation between a reinforcement plate bonding material and the WB strength.

FIG. 3 shows a test result of a bonding strength for FPC's which use an acryl bonding film and an epoxy bonding film to bond a reinforcement plate and a polyimide base film. No difference is observed between the bonding strengths but the epoxy bonding film can be bonded at a lower ultrasonic wave strength than that of the acryl bonding film and a better WB condition is attained. When it is used together with the condition of the nickel plating thickness, the reliability and margin of the WB are further increased.

Figure 5:
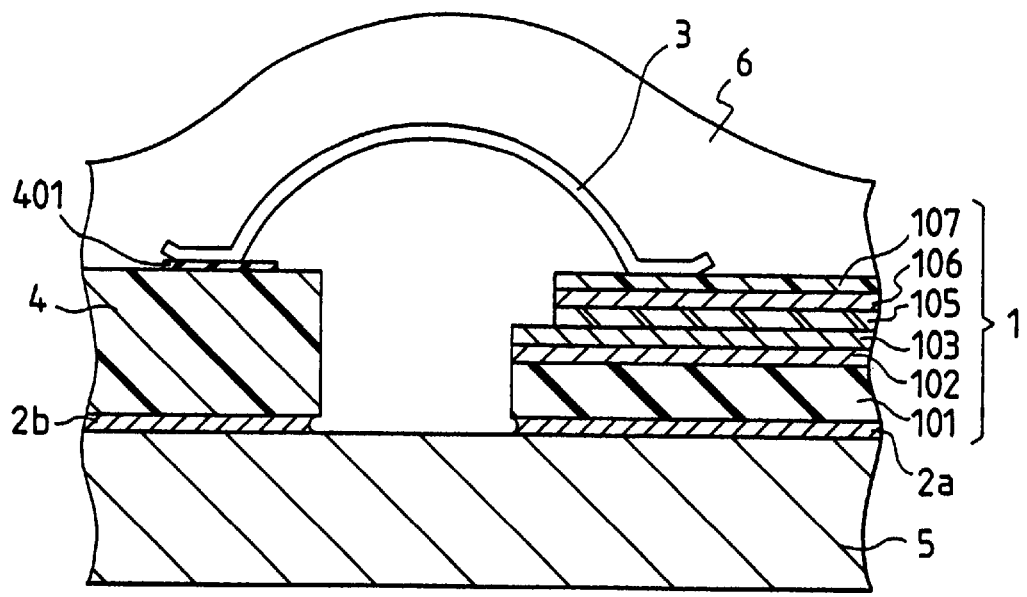
FIG. 5 shows a sectional view of a WB part of a second embodiment of the ink jet recording head of the present invention.

In the above FPC construction, the epoxy bonding material is used to bond the conductive layer made of the copper foil and the polyimide base film. Alternatively, as shown in FIG. 5, an FPC without a bonding layer between the conductive layer and the polymide layer (which may be prepared by coating a polymide on a copper foil) may be used to further increase the hardness of the conductive layer underlying layer and enhance the WB condition.

Figure 6:
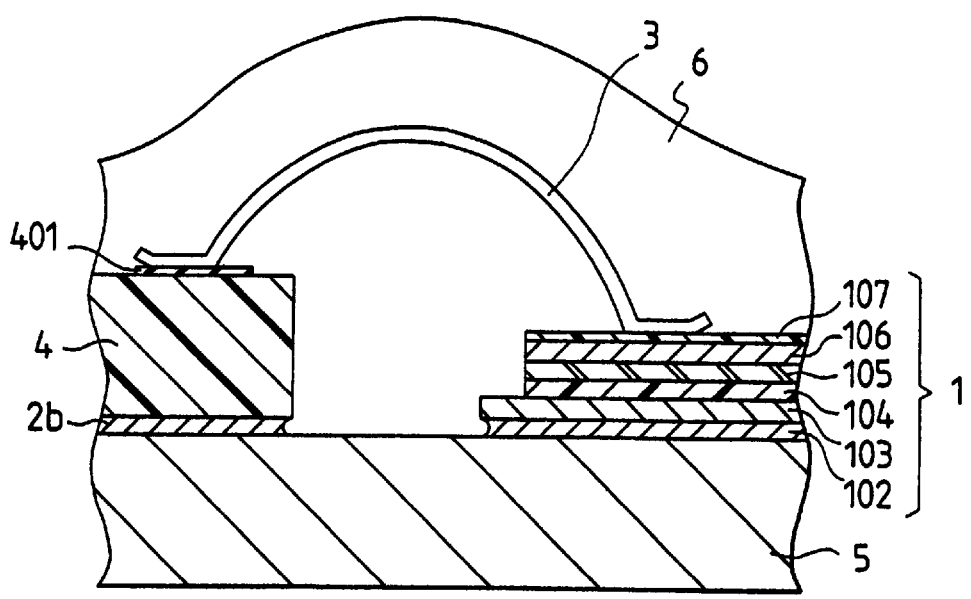
FIG. 6 shows a sectional view of a WB part of a third embodiment of the ink jet recording head of the present invention.
Figure 7:
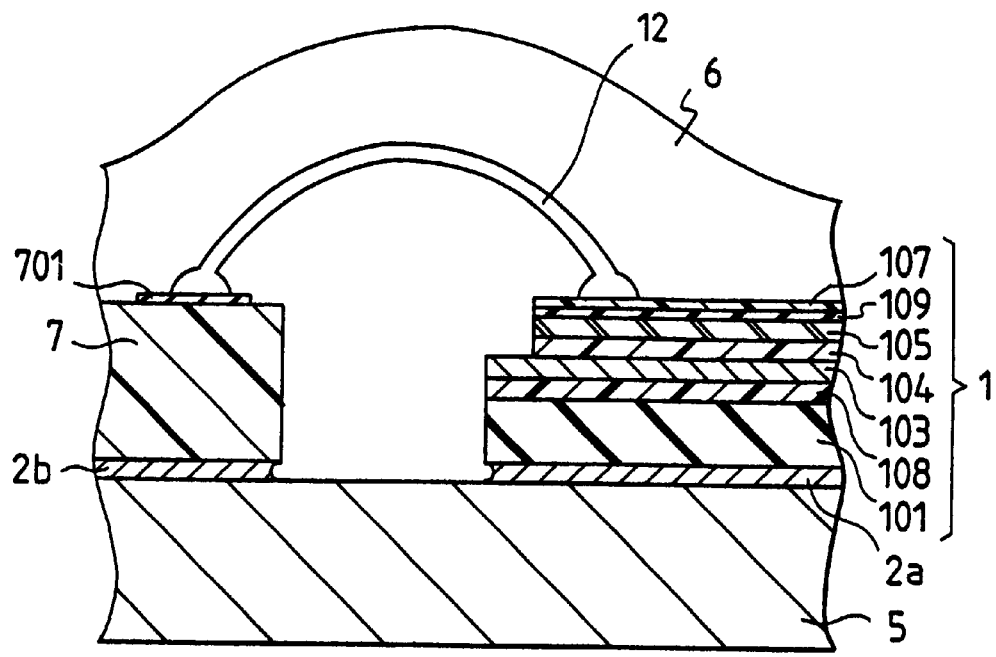
FIG. 7 shows a sectional view of a WB part of a prior art ink jet recording head.
Figure 8:
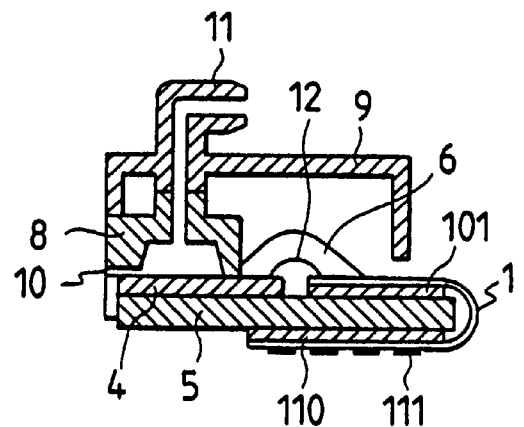
FIG. 8 shows a sectional view of a prior art ink jet recording head.

As shown in FIG. 6, the reinforcement plate may not be used and the base film 103 may be directly bonded to the support plate 5 by an epoxy bonding film or an epoxy bonding material 102 to attain the same effect.

An embodiment of an ink jet recording head which uses the above means is now explained with reference to FIG. 1.

(Embodiment 1)

Figure 1:
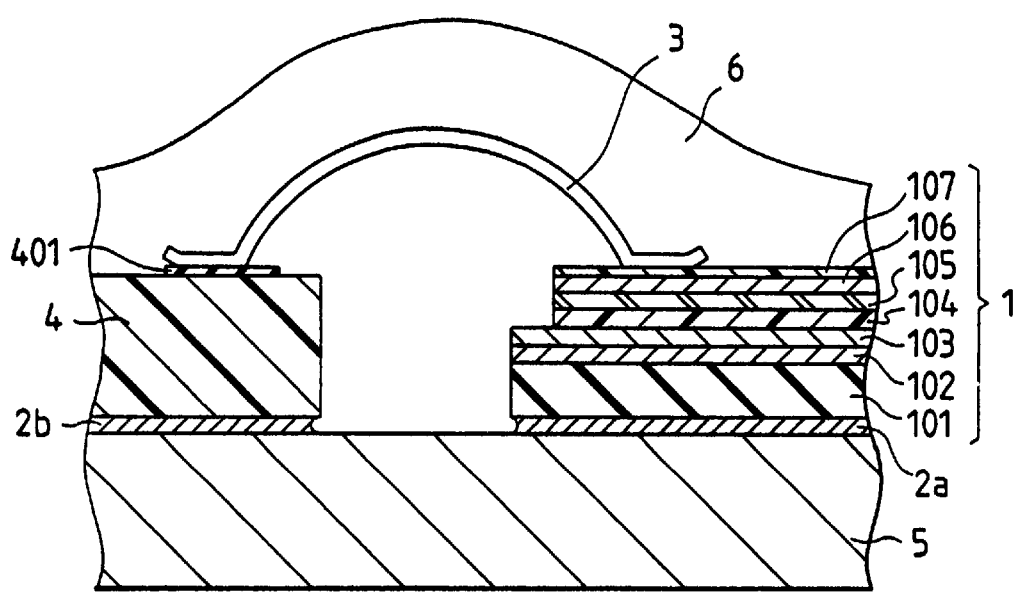
FIG. 1 shows a sectional view of a WB art of a first embodiment of an ink jet recording head of the present invention.

FIG. 1 shows a sectional view of a layer structure of a WB packaging part of an ink jet recording head having an FPC of the present invention.

On a substrate 5 of the ink jet recording head made of aluminum, a reinforcement plate 101 made of glass epoxy is bonded by a bonding material 2a, and a base film 103 made of polymide is bonded to the reinforcement plate 101 through a bonding layer 102 made of an epoxy heat setting bonding film. A conductive layer 105, a nickel plating layer 106 and a gold plate layer 107 having thicknesses of 18 $\mu$m, 10 $\mu$m and 1 $\mu$m, respectively, are sequentially stacked by plating on the base film 103 through a bonding layer 104 made of epoxy resin to form an FPC. A heater board 4 is bonded by a bonding material 2b adjacent to the reinforcement plate 101 on the substrate 5.

Figure 4A:
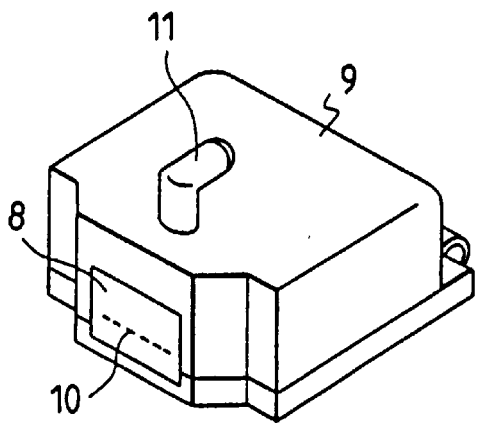
FIGS. 4A and 4B show top, bottom and perspective views of the first embodiment of the ink jet recording head of the present invention.
Figure 4B:
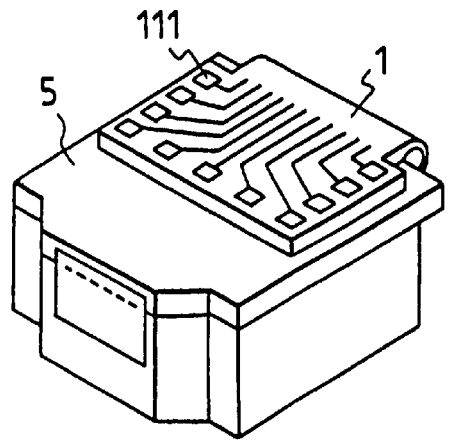

An aluminum wire 3 is wedge bonded to the gold plating layer 107 of the FPC 1 and the aluminum WB pad of the heater board 4 to electrically connect the FPC 1 and the heater board 4. Sealing agent 6 of silicone rubber is applied to the bonding part to complete the ink jet recording head shown in FIGS. 4A and 4B.

(Embodiment 2)

An ink jet recording head was formed with the same condition as that of the Embodiment 1 except that the thickness of the nickel plating layer was 20 $\mu$m.

COMPARATIVE EXAMPLE 1

An ink jet recording head was formed with the same condition as that of the Embodiment 1 except that the thickness of the nickel plating layer was 30 $\mu$m.

COMPARATIVE EXAMPLE 2

An ink jet recording head was formed with the same condition as that of the Embodiment 1 except that the reinforcement plate and the base film were bonded by an acryl bonding film instead of the thermal setting film and the thickness of the nickel plating layer was 3 $\mu$m.

The ink jet recording heads of the embodiments and the comparative examples were tested for durability. The ink jet recording head has 48 nozzles and the same number of wire bondings as the number of nozzles are provided. The test was made by leaving the ink jet recording head in an environment of a temperature of 60° C. and a humidity of 90% for one month and a current was conducted through each wire to test the conductivity.

A result is shown in Table 1. Numerals in the table show the number of breaks and numerals in parentheses show that the bonding was not achieved from the beginning.

TABLE 1

| Embodiment 1 | 0(0) |
| Embodiment 2 | 0(0) |
| Comparative Example 1 | 21(0) |
| Comparative Example 2 | 38(25) |

As seen from Table 1, the ink jet recording heads of the embodiments exhibited good results without break of wire. On the other hand, the comparative example 1 exhibited the break of wire. It is considered that this is due to the poor flatness of the surface of the pad area which reduces the bonding area resulting in the breakdown by a stress due to a temperature change of the sealing agent. In the comparative example 2, not only the break at the conduction of the current is observed but also more than half of the bonding were not formed from the beginning. It is considered that this is because the strength at the bonding area is insufficient and the vibration is attenuated to cause the defects in the connection of the bonding.

In the present embodiment, an ink jet recording head which forms bubbles of the ink by using a thermal energy to discharge ink droplets has been shown although other recording head such as one which discharges ink droplets by using a piezoelectric element may be used in the present invention.

The present invention is not limited to the illustrated embodiments but the wire bonding of the FPC by using the aluminum wire falls in the scope of the present invention.

In accordance with the present invention, nickel and gold are plated in this order on the conductive pattern of the copper foil at the wire bonding area of the FPC, the thickness of the nickel plating layer is selected to 10 $\mu$m to 20 $\mu$m and the FPC is bonded to the reinforcement plate by the epoxy bonding film. Thus, the high reliability wire bonding on the FPC is attained with the stable condition and the high reliability and inexpensive ink jet recording head is provided by using the FPC.

What is claimed is:

1. A method of producing a flexible wiring substrate electrically connected to a substrate by wire bonding, comprising the steps of:

providing a base film of polymide;

stacking a conductive layer comprising copper on said base film;

stacking a closely bonding metal layer comprising nickel by plating on said conductive layer, said closely bonding metal layer having a thickness of 10–20 $\mu$m, so that said closely bonding metal layer is a plated layer;

forming a gold plating layer on said closely bonding metal layer;

aligning a contact section of said flexible wiring substrate and a contact section of said substrate to a predetermined position; and ultrasonically melt bonding an aluminum wire to the respective contact sections, thereby electrically connecting the contact sections.

2. A method of producing an ink jet recording head emitting an ink for recording on a recording medium, wherein a flexible wiring substrate electrically connects a recording apparatus to an ink emitting section, comprising the steps of:

providing a base film of polymide;

stacking a conductive layer comprising copper on said base film;

stacking a closely bonding metal layer comprising nickel on said conductive layer, said closely bonding metal layer having a thickness of 10–20 $\mu$m, so that said closely bonding metal layer is a plated layer;

forming a gold plating layer on said closely bonding metal layer;

aligning a contact section of said flexible wiring substrate and a contact section of said substrate to a predetermined position; and ultrasonically melt bonding an aluminum wire to the respective contact sections, thereby electrically connecting the contact sections.

3. A method according to either of claims 1 or 2, further comprising the step of providing a common supporting body, and wherein said substrate and said wiring substrate are both supported on said common supporting body.

4. A method according to claim 3, further comprising the step of providing a reinforcement plate between said wiring substrate and said supporting body.

5. A method according to claim 4, further comprising the step of bonding the base film of said wiring substrate to said reinforcement plate using epoxy bonding film.

6. A method according to claim 3, further comprising the step of bonding said wiring substrate to said supporting body using an epoxy type bonding film.

7. A wiring substrate according to claim 3, wherein said substrate comprises an electro-thermal transducer generating energy for emitting an ink, and said electro-thermal transducer is electrically connected to said aluminum wire.

\* \* \* \* \*